(12) United States Patent  
Kameyama et al.

(10) Patent No.: US 7,670,955 B2
(45) Date of Patent: Mar. 2, 2010

(54) SEMICONDUCTOR DEVICE AND MANUFACTURING METHOD OF THE SAME

(75) Inventors: Kojiro Kameyama, Gunma (JP); Akira Suzuki, Gunma (JP); Mitsuo Umemoto, Gunma (JP)

(73) Assignees: Sanyo Electric Co., Ltd., Moriguchi-shi (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 11/969,065

(22) Filed: Jan. 3, 2008

(65) Prior Publication Data

US 2008/0132038 A1  Jun. 5, 2008

Related U.S. Application Data

(62) Division of application No. 11/257,390, filed on Oct. 25, 2005, now Pat. No. 7,339,273.

(30) Foreign Application Priority Data

Oct. 26, 2004 (JP) .............................. 2004-310726

(51) Int. Cl.
*H01L 21/311* (2006.01)
*H01L 21/302* (2006.01)
*H01L 21/461* (2006.01)
*H01L 29/40* (2006.01)

(52) U.S. Cl. ............... 438/700; 257/774; 257/E21.577; 438/713; 438/978

(58) Field of Classification Search ................ 257/774, 257/629, 630, E23.067, E21.578; 438/700, 438/701, 713, 978
See application file for complete search history.

(56) References Cited

U.S. PATENT DOCUMENTS 4,097,890 A  6/1978  Morris et al.
(Continued)

FOREIGN PATENT DOCUMENTS

EP          1376678            1/2004
(Continued)

OTHER PUBLICATIONS

Microchip Fabrication, Peter Van Zant, McGraw-Hill, Fourth Edition, pp. 402-403.

(Continued)

*Primary Examiner*—David Vu
*Assistant Examiner*—Earl N Taylor
(74) *Attorney, Agent, or Firm*—Morrison & Foerster LLP

(57) ABSTRACT

The invention is directed to a semiconductor device having a penetrating electrode and a manufacturing method thereof in which reliability and a yield of the semiconductor device are enhanced. A semiconductor substrate is etched to form a via hole from a back surface of the semiconductor substrate to a pad electrode. This etching is performed under an etching condition such that an opening diameter of the via hole at its bottom is larger than a width of the pad electrode. Next, a second insulation film is formed on the back surface of the semiconductor substrate including in the via hole 16, exposing the pad electrode at the bottom of the via hole. Next, a penetrating electrode and a wiring layer are formed, being electrically connected with the pad electrode exposed at the bottom of the via hole 16. Furthermore, a protection layer and a conductive terminal are formed. Finally, the semiconductor substrate is cut and separated in semiconductor dies by dicing.

6 Claims, 7 Drawing Sheets

U.S. PATENT DOCUMENTS

| | | | |
|---|---|---|---|
| 4,964,212 A | 10/1990 | Deroux-Dauphin et al. | |
| 5,056,216 A | 10/1991 | Madou et al. | |
| 5,149,674 A | 9/1992 | Freeman et al. | |
| 5,229,647 A | 7/1993 | Gnadinger et al. | |
| 5,248,903 A | 9/1993 | Heim | |
| 5,284,797 A | 2/1994 | Heim | |
| 5,397,907 A | 3/1995 | Lee | |
| 5,432,119 A | 7/1995 | Le et al. | |
| 5,739,587 A | 4/1998 | Sato | |
| 5,910,687 A | 6/1999 | Chen et al. | |
| 5,915,167 A | 6/1999 | Leedy | |
| 5,949,140 A | 9/1999 | Nishi et al. | |
| 5,985,749 A | 11/1999 | Lin et al. | |
| 6,020,217 A | 2/2000 | Kuisl et al. | |
| 6,031,293 A | 2/2000 | Hsuan et al. | |
| 6,204,074 B1 | 3/2001 | Bertolet et al. | |
| 6,242,813 B1 | 6/2001 | Huang et al. | |
| 6,281,448 B1 | 8/2001 | Tsukamoto | |
| 6,297,563 B1 | 10/2001 | Yamaha | |
| 6,323,546 B2 | 11/2001 | Hsuan et al. | |
| 6,391,770 B2 | 5/2002 | Kosaki et al. | |
| 6,562,709 B1 | 5/2003 | Lin | |
| 6,642,615 B2 | 11/2003 | Hashimoto et al. | |
| 6,716,737 B2 | 4/2004 | Plas et al. | |
| 6,720,661 B2 | 4/2004 | Hanaoka et al. | |
| 6,734,568 B2 | 5/2004 | Matsuo et al. | |
| 6,746,953 B2 | 6/2004 | Kramer et al. | |
| 6,768,205 B2 | 7/2004 | Taniguchi et al. | |
| 6,773,952 B2 | 8/2004 | Armbrust et al. | |
| 6,838,362 B2 | 1/2005 | Mastromatteo et al. | |
| 6,943,442 B2 | 9/2005 | Sunohara et al. | |
| 7,045,896 B2 | 5/2006 | Ahn | |
| 7,094,701 B2 | 8/2006 | Umemoto et al. | |
| 7,101,735 B2 | 9/2006 | Noma et al. | |
| 7,114,251 B2 | 10/2006 | Mashino | |
| 7,214,615 B2 | 5/2007 | Miyazawa | |
| 7,247,939 B2 | 7/2007 | Huang et al. | |
| 7,339,273 B2 * | 3/2008 | Kameyama et al. | 257/774 |
| 2002/0025587 A1 | 2/2002 | Wada | |
| 2003/0025173 A1 | 2/2003 | Suminoe et al. | |
| 2003/0045085 A1 | 3/2003 | Taniguchi et al. | |
| 2003/0137056 A1 | 7/2003 | Taniguchi et al. | |
| 2003/0160293 A1 | 8/2003 | Iadanza | |
| 2003/0230805 A1 | 12/2003 | Noma et al. | |
| 2004/0016942 A1 | 1/2004 | Miyazawa et al. | |
| 2004/0017419 A1 | 1/2004 | Lai et al. | |
| 2004/0045668 A1 | 3/2004 | Iwasaki et al. | |
| 2004/0072413 A1 | 4/2004 | Hashimoto et al. | |
| 2004/0104485 A1 * | 6/2004 | Yokoyama | 257/774 |
| 2004/0137701 A1 | 7/2004 | Takao | |
| 2004/0137723 A1 | 7/2004 | Noma et al. | |
| 2004/0140563 A1 | 7/2004 | Ahn | |
| 2004/0188807 A1 | 9/2004 | Hiraoka et al. | |
| 2004/0251554 A1 | 12/2004 | Masuda | |
| 2005/0003649 A1 | 1/2005 | Takao | |
| 2005/0023700 A1 | 2/2005 | Singh et al. | |
| 2005/0167812 A1 | 8/2005 | Yoshida et al. | |
| 2005/0189637 A1 * | 9/2005 | Okayama et al. | 257/679 |
| 2006/0033168 A1 * | 2/2006 | Umemoto et al. | 257/379 |
| 2006/0087042 A1 * | 4/2006 | Kameyama et al. | 257/774 |
| 2006/0108691 A1 | 5/2006 | Kameyama et al. | |
| 2006/0108695 A1 * | 5/2006 | Kameyama et al. | 257/774 |
| 2006/0202348 A1 * | 9/2006 | Kameyama et al. | 257/774 |
| 2007/0249158 A1 | 10/2007 | Okayama et al. | |
| 2009/0124078 A1 | 5/2009 | Kameyama et al. | |

FOREIGN PATENT DOCUMENTS

| | | |
|---|---|---|
| EP | 1408547 | 4/2004 |
| EP | 1439576 | 7/2004 |
| EP | 1 564 805 A1 | 8/2005 |
| EP | 1 564 810 | 8/2005 |
| EP | 1564806 | 8/2005 |
| EP | 1653508 | 5/2006 |
| JP | 2002-512436 | 4/2002 |
| JP | 2002-348697 | 12/2002 |
| JP | 2003-309221 | 10/2003 |
| JP | 2004-296488 | 10/2004 |
| JP | 2005-5322 | 1/2005 |
| JP | 2005-183548 | 7/2005 |
| JP | 2005-268456 | 9/2005 |
| WO | WO-96/13062 | 5/1996 |
| WO | WO-99/40624 | 8/1999 |
| WO | WO 2004/064159 | 7/2004 |

OTHER PUBLICATIONS

European Office Action, dated Jul. 11, 2008, directed to related European Patent Application No. 05 002 897.6; 5 pages.

European Search Report, dated Jun. 25, 2009, directed to European Patent Application No. 06 00 4779.2; 8 pages.

Okayama, Y. et al. U.S. Office Action mailed Sep. 1, 2009, directed to a related U.S. Appl. No. 11/808,667; 11 pages.

EP Search Report dated Aug. 4, 2009, directed to Application No. 05023591.0 (10 pages).

EP Search Report dated Jul. 10, 2009, directed to Application No. 05023408.7 (10 pages).

Okayama et al., U.S. Office Action mailed Aug. 3, 2009, directed to related U.S. Appl. No. 11/055,707; (11 pages).

Okayama et al., U.S. Office Action mailed on Jul. 9, 2009 directed to U.S. Appl. No. 11/808,667;11 pages.

European Search Report, dated Apr. 24, 2009, directed to related European Patent Application No. 05023408.7; (5 pages).

European Search Report, dated May 8, 2009, directed to counterpart European Patent Application No. 05023409.5; (5 pages).

Kameyama et al., U.S. Office Action mailed Jul. 9, 2007, directed to related U.S. Appl. No. 11/260,682; (8 pages).

Kameyama et al., U.S. Office Action mailed Dec. 27, 2007, directed to related U.S. Appl. No. 11/260,682; (8 pages).

Kameyama et al., U.S. Office Action mailed May 12, 2008, directed to related U.S. Appl. No. 11/260,682; (7 pages).

Kameyama et al., U.S. Office Action mailed Oct. 29, 2008, directed to related U.S. Appl. No. 11/260,682; (6 pages).

Kameyama et al., U.S. Office Action mailed Feb. 26, 2009, directed to related U.S. Appl. No. 11/260,682; (6 pages).

Kameyama et al., U.S. Office Action mailed May 14, 2008, directed to related U.S. Appl. No. 11/257,406; (6 pages).

Kameyama et al., U.S. Office Action mailed Nov. 13, 2008, directed to related U.S. Appl. No. 11/257,406; (9 pages).

Kameyama et al., U.S. Office Action mailed Apr. 16, 2007, directed to related U.S. Appl. No. 11/257,390; (11 pages).

Okayama et al., U.S. Office Action mailed Jun. 29, 2006, directed to related U.S. Appl. No. 11/055,707; (6 pages).

Okayama et al., U.S. Office Action mailed Nov. 21, 2006, directed to related U.S. Appl. No. 11/055,707; (10 pages).

Okayama et al., U.S. Office Action mailed Aug. 9, 2007, directed to related U.S. Appl. No. 11/055,707; (15 pages).

Okayama et al., U.S. Office Action mailed Jan. 28, 2008 directed to related U.S. Appl. No. 11/055,707; (15 pages).

Okayama et al., U.S. Office Action mailed Sep. 3, 2008, directed to related U.S. Appl. No. 11/055,707; (15 pages).

Okayama et al., U.S. Office Action mailed Feb. 6, 2009, directed to related U.S. Appl. No. 11/055,707; (19 pages).

Okayama et al., U.S. Office Action mailed May 1, 2008, directed to related U.S. Appl. No. 11/808,667; (10 pages).

Okayama et al., U.S. Office Action mailed Oct. 10, 2008, directed to related U.S. Appl. No. 11/808,667; (10 pages).

Okayama et al., U.S. Office Action mailed Feb. 13, 2009, directed to related U.S. Appl. No. 11/808,667; (12 pages).

Kanneyama et al., U.S. Office Action mailed Dec. 31, 2007, directed to related U.S. Appl. No. 11/362,503; (8 pages).

Kameyama et al., U.S. Office Action mailed Jun. 8, 2009, directed to related U.S. Appl. No. 12/346,667; (12 pages).

* cited by examiner

US 7,670,955 B2

SEMICONDUCTOR DEVICE AND MANUFACTURING METHOD OF THE SAME

CROSS-REFERENCE OF THE INVENTION

This invention is based on Japanese Patent Application No. 2004-310726, the content of which is incorporated by reference in its entirety.

This application is a divisional of Ser. No. 11/257,390, filed Oct. 25, 2005, now U.S. Pat. No. 7,339,273.

BACKGROUND OF THE INVENTION

1. Field of the Invention

The invention relates to a semiconductor device and a manufacturing method thereof, particularly, a semiconductor device having a penetrating electrode and a manufacturing method thereof.

2. Description of the Related Art

CSP (Chip Size Package) has received attention in recent years as a three-dimensional mounting technology as well as a new packaging technology. The CSP means a small package having almost the same outside dimensions as those of a semiconductor die packaged in it.

Conventionally, BGA (Ball Grid Array) type semiconductor devices having penetrating electrodes have been known as a kind of CSP. This BGA type semiconductor device has a penetrating electrode penetrating a semiconductor substrate and connected with a pad electrode. In this BGA type semiconductor device, a plurality of ball-shaped conductive terminals made of metal such as solder is arrayed in a grid pattern on a back surface of the device.

When this semiconductor device is mounted on electronic equipment, the ball-shaped conductive terminals are connected to wiring patterns on a circuit board (e.g. printed board).

Such a BGA type semiconductor device has advantages in providing a large number of conductive terminals and in reducing size over other CSP type semiconductor devices such as SOP (Small Outline Package) and QFP (Quad Flat Package), which have lead pins protruding from their sides.

Next, a conventional manufacturing method of the BGA-type semiconductor device having the penetrating electrode will briefly described. First, on a front surface of a semiconductor substrate formed with a pad electrode with a first insulation film therebetween, a supporting body is attached with a resin layer therebetween. The attachment of this supporting body is performed according to needs, and not necessarily performed.

Next, a via hole is formed from a back surface of the semiconductor substrate to the pad electrode by etching the semiconductor substrate. Furthermore, a second insulation film is formed on the back surface of the semiconductor substrate including in the via hole, exposing the pad electrode at a bottom of the via hole.

Furthermore, a penetrating electrode is formed on the second insulation film in the via hole, being electrically connected with the pad electrode exposed at the bottom. At the same time as this, a wiring layer is formed on the second insulation film on the back surface of the semiconductor substrate, being connected with the penetrating electrode. Then, a protection layer is formed on the back surface of the semiconductor substrate including on the wiring layer.

Furthermore, a part of the protection layer may be opened to expose a part of the wiring layer, and a conductive terminal may be formed on this wiring layer. Then, the semiconductor substrate is cut and separated into a plurality of semiconductor dies by dicing. The relevant technology is disclosed in the Japanese Patent Application Publication No. 2003-309221.

Next, the above-described conventional semiconductor device manufacturing method will be partially described with reference to figures. FIGS. 11 and 12 are cross-sectional views showing the conventional semiconductor device manufacturing method.

In the conventional semiconductor device, as shown in FIG. 11, a pad electrode 52 is formed on a front surface of a semiconductor substrate 50 with an insulation film 51 therebetween in so-called front-end processes. Furthermore, in subsequent processes, a supporting body 54 is attached on the front surface of the semiconductor substrate 50 formed with the pad electrode 52 with a resin layer 53 therebetween. Thermal stresses (called residual stress or intrinsic stress) are likely to be generated in the pad electrode 52 when the pad electrode 52 is deposited.

However, as shown in FIG. 12, when the semiconductor substrate 50 is etched using the resist layer 55 as a mask to form a via hole 56 penetrating the semiconductor substrate 50, the pad electrode 52 at a bottom of the via hole 56 is deformed, projecting into the via hole 56, although it should be flat.

This deformation of the pad electrode 52 is caused by that the stress accumulated in the pad electrode 52 when the pad electrode 52 is deposited in the front-end processes loses its balance by a thermal load in a thermal cycle test and so on, and thus the stress is concentrated in the pad electrode 52 at the bottom of the via hole 56 so as to be released therefrom. Furthermore, the deformation also occurs after the insulation film 51 is etched.

Furthermore, after a penetrating electrode (not shown) formed of, for example, copper (Cu) is formed, being connected with the pad electrode 52 at the bottom of the via hole 56, the pad electrode 52 is deformed projecting on the back surface side of the semiconductor substrate 50 like being pulled by the penetrating electrode. This deformation is caused by a relation between residual stress accumulated in the penetrating electrode when the penetrating electrode is formed and the stress accumulated in the pad electrode 52.

Furthermore, the deformation of the pad electrode 52 described above sometimes causes damage or disconnection in the pad electrode 52 by metal fatigue. Therefore, after the penetrating electrode (not shown) formed of, for example, copper (Cu) is formed in the via hole 56 including on the deformed pad electrode 52, there sometimes occurs connection failure between the penetrating electrode and the pad electrode exposed in the via hole 56. That is, the deformation of the pad electrode 52 causes a problem of decreasing the reliability of the semiconductor device having the penetrating electrode. As a result, the reliability and yield of the semiconductor device having the penetrating electrode decreases.

SUMMARY OF THE INVENTION

The invention provides a semiconductor device that includes a semiconductor die having a first insulation film disposed on the front surface and a pad electrode disposed on part of the first insulation film. The semiconductor die has a via hole formed from the back surface of the semiconductor die toward the pad electrode, and the diameter of the via hole at the front surface is larger than the width of the pad electrode.

The invention provides another semiconductor device that includes a semiconductor die having a first insulation film disposed on the front surface, and a pad electrode disposed on part of the first insulation film. The semiconductor die has a via hole formed from the back surface of the semiconductor die toward the pad electrode, and at least part of the rim portion of the via hole at the front surface extends beyond the area of the front surface covered by the pad electrode.

The invention also provides a method of manufacturing a semiconductor device. The method includes providing a semiconductor substrate having a first insulation film disposed on the front surface thereof and a pad electrode disposed on the first insulation film, etching the semiconductor substrate from the back surface to form a via hole to expose the first insulation film located above the pad electrode, and etching the exposed first insulation film to expose at least part of the pad electrode. The etching of the semiconductor substrate is performed so that a diameter of the via hole at the front surface is larger than a width of the pad electrode.

The invention provides another method of manufacturing a semiconductor device. The method includes providing a semiconductor substrate having an insulation film disposed on the front surface and a pad electrode disposed on the insulation film, etching the semiconductor substrate from the back surface to form a via hole to expose the insulation film located above the pad electrode, and etching the exposed insulation film to expose at least part of the pad electrode. The etching of the semiconductor substrate is performed so that at least part of a rim portion of the via hole at the front surface extends beyond an area of the front surface covered by the pad electrode.

DETAILED DESCRIPTION OF THE INVENTION

A semiconductor device manufacturing method of an embodiment of the invention will be described with reference to figures. FIGS. 1 to 9 are cross-sectional views showing the semiconductor device manufacturing method of the embodiment. FIGS. 1 to 9 show a portion of a semiconductor substrate near a dicing line (not shown).

Figure 1:
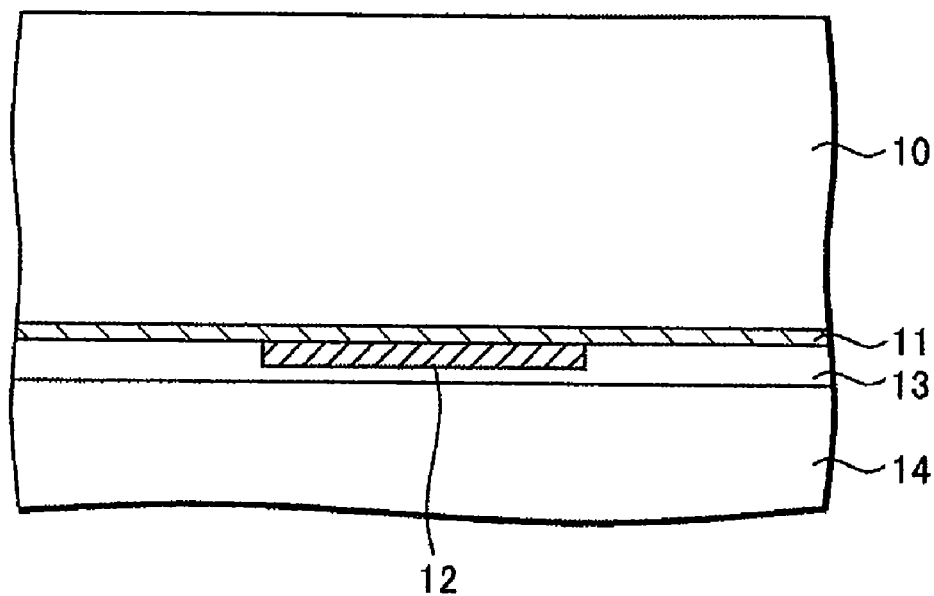
FIGS. 1 to 8 are cross-sectional views for explaining a semiconductor device manufacturing method of an embodiment of the invention.

First, as shown in FIG. 1, a semiconductor substrate 10 formed with an electronic device (not shown) on its front surface is prepared. The electronic device (not shown) is a light receiving element such as a CCD (Charge Coupled Device) or an infrared ray sensor, or a light emissive element, for example. Alternatively, the electronic device (not shown) can be the other electronic device than the light receiving element or the light emissive element. The semiconductor substrate 10 is formed of a silicon substrate, for example, but can be a substrate formed of the other material. The semiconductor substrate 10 preferably has a thickness of about 130 µm.

Next, a first insulation film 11 is formed as an interlayer insulation film on the front surface of the semiconductor substrate 10 including the electronic device (not shown). The first insulation film 11 is formed of, for example, a P-TEOS film or a BPSG film. The first insulation film 11 preferably has a thickness of about 0.8 µm.

Furthermore, a pad electrode 12 as an external connection electrode is formed on the front surface of the semiconductor substrate 10, being connected with the electronic device (not shown). The pad electrode 12 is formed on the front surface of the semiconductor substrate 10 with the first insulation film 11 therebetween. The pad electrode 12 is formed of, for example, aluminum (Al), and preferably has a thickness of about 1 µm. At this time, the pad electrode 12 is deposited flat, and a predetermined amount of stress corresponding to a deposition condition is accumulated in the pad electrode 12.

The electronic device (not shown), the first insulation film 11, and the pad electrode 12 described above are formed in so-called front-end processes in a semiconductor device manufacturing process.

Next, according to needs, a supporting body 14 is attached on the front surface of the semiconductor substrate 10 with a resin layer 13 therebetween. In a case that the electronic device (not shown) is the light receiving element or the light emissive element, the supporting body 14 is formed of a transparent or semitransparent material such as glass, for example. In a case that the electronic device (not shown) is not the light receiving element or the light emissive element, the supporting body 14 is not necessarily formed of a transparent or semitransparent material. The supporting body 14 can form a tape-like shape. Furthermore, this supporting body 14 can be removed in a subsequent process. Alternatively, the supporting body 14 can be left without removed, or the attachment of the supporting body 14 can be omitted.

Figure 2:
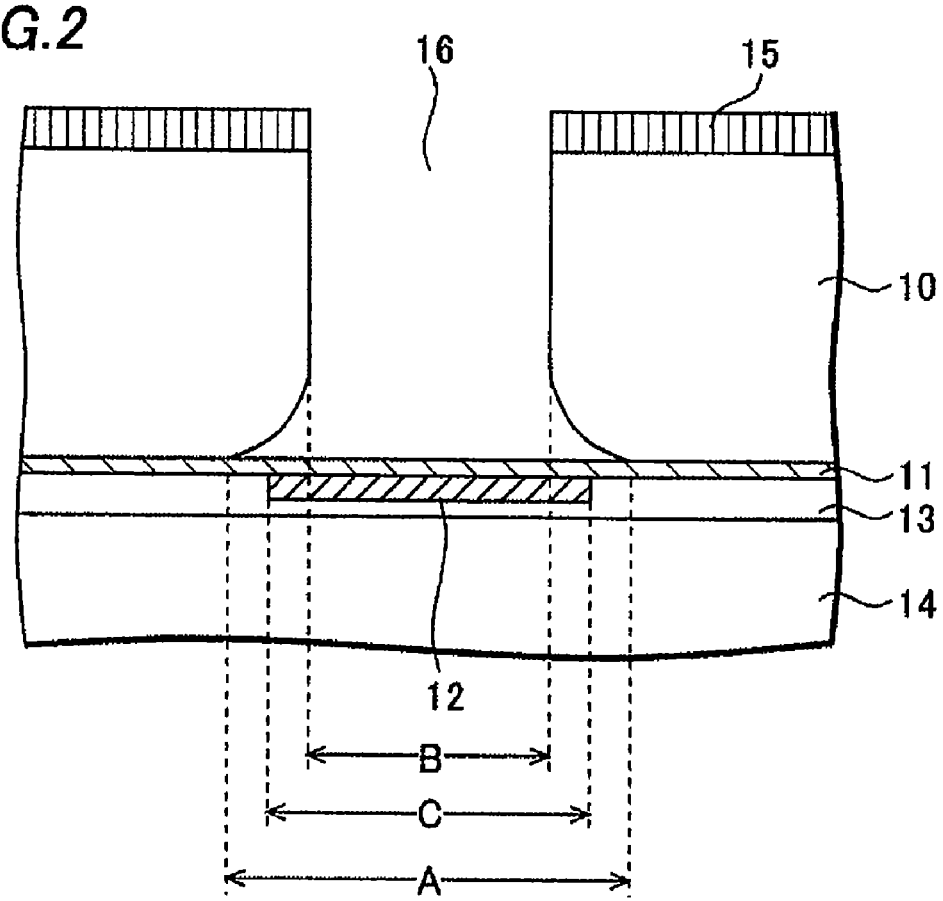

Next, as shown in FIG. 2, a first resist layer 15 is selectively formed on a back surface of the semiconductor substrate 10. That is, the first resist layer 15 has an opening in a position corresponding to the pad electrode 12 on the back surface of the semiconductor substrate 10.

Next, the semiconductor substrate 10 is etched by, preferably, a dry etching method using this first resist layer 15 as a mask. This etching is performed under a condition such that an opening diameter A of the via hole 16 at its bottom becomes larger than a width C of the pad electrode 12. Furthermore, this etching can be performed under a condition such that an opening diameter B of the via hole 16 at its top to middle of the depth is smaller than the opening diameter A of the via hole 16 at its bottom and the width C of the pad electrode 12.

As etching gas, gas containing $SF_6$, $O_2$, $C_4F_8$, or the like is used, for example. When $SF_6$ and $O_2$ is used as etching gas, it is preferable to perform the etching under the etching condition of about 1.5 KW of power, 300/30 sccm of gas flow, and 25 Pa of pressure, for example.

By this etching, the via hole penetrating the semiconductor substrate 10 from the back surface to the front surface is formed above the pad electrode 12, having characteristics described below. That is, the first insulation film 11 is exposed at the bottom of the via hole 16. The etching of the substrate 10 is continued even after the first insulation film 11 is exposed at the bottom of the via hole 16, so that the sidewall of the via hole 16 is further etched and the opening of the via hole 16 at its bottom is widened as shown in FIG. 2. As a result, the opening diameter A of the via hole 16 at its bottom is larger than the width C of the pad electrode 12. Referring to the pad electrode 12 adjacent to the first insulation film 11 at the bottom of the via hole 16, its whole surface (the surface on the side opposed to the via hole 16) is opposed to the opening of the via hole 16 with the first insulation film 11 therebetween.

As described above, an area of the opening of the via hole 16 opposed to the pad electrode 12 is larger than an area of an opening of a via hole 56 opposed to a pad electrode 52 of the conventional semiconductor device. Therefore, stress accumulated in the pad electrode 12 when the pad electrode 12 is deposited is released from the bottom of the via hole 16 more effectively than in the conventional art. This minimizes the deformation of the pad electrode 12 such as projecting into the via hole 16 as has been seen in the conventional art. Furthermore, since a rim of the opening is not positioned above the pad electrode 12, the deformation of the pad electrode 12 with this rim of the opening as a fulcrum can be prevented. This can minimize damage or disconnection caused by metal fatigue from occurring in the pad electrode 12.

Figure 3:
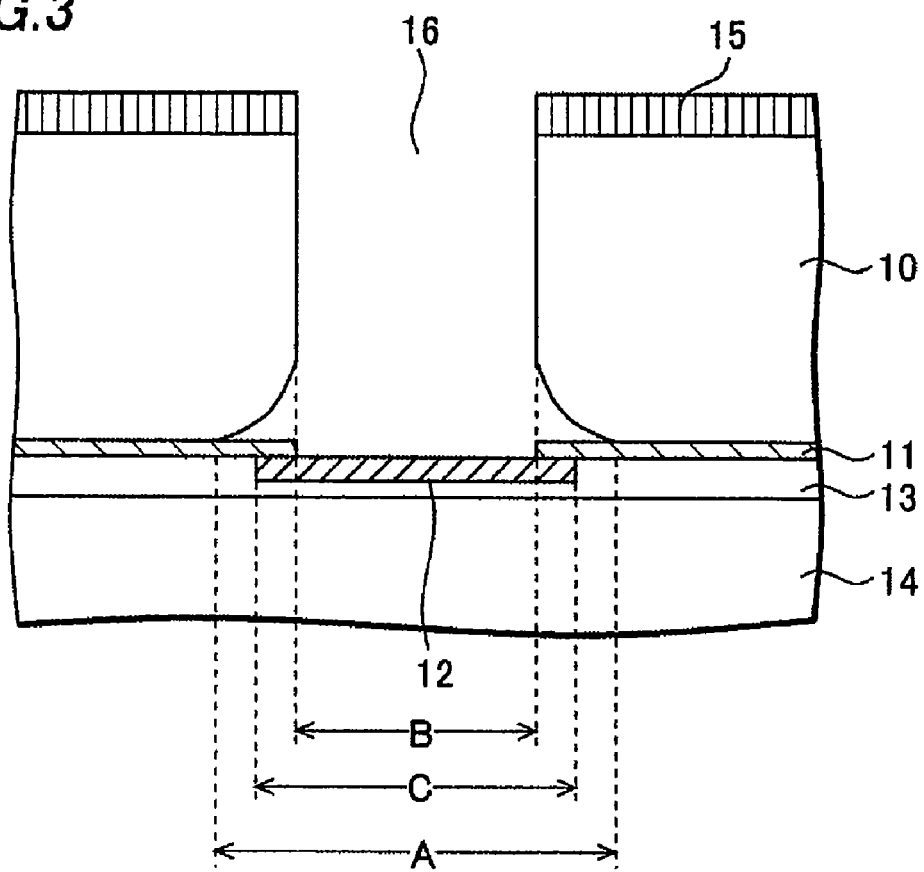

Next, as shown in FIG. 3, a part of the first insulation film 11 exposed at the bottom of the via hole 16 is selectively removed using the first resist layer 15 as a mask. By this process, a part of the pad electrode 12 is exposed at the bottom of the via hole 16. Then, the first resist layer 15 is removed.

Figure 4:
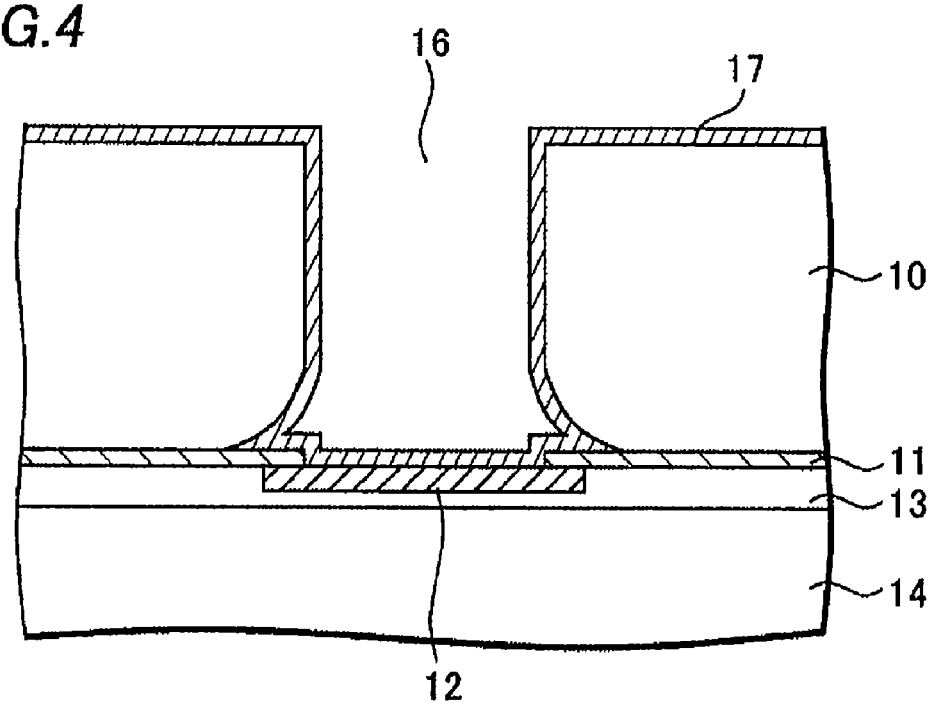

Next, as shown in FIG. 4, a second insulation film 17 is formed on the back surface of the semiconductor substrate 10 including in the via hole 16. The second insulation film 17 is formed of, for example, a silicon oxide film ($SiO_2$ film) or a silicon nitride film (SiN film), and formed by, for example, a plasma CVD method. The second insulation film 17 preferably has a thickness of about 1 to 2 μm.

Figure 5:
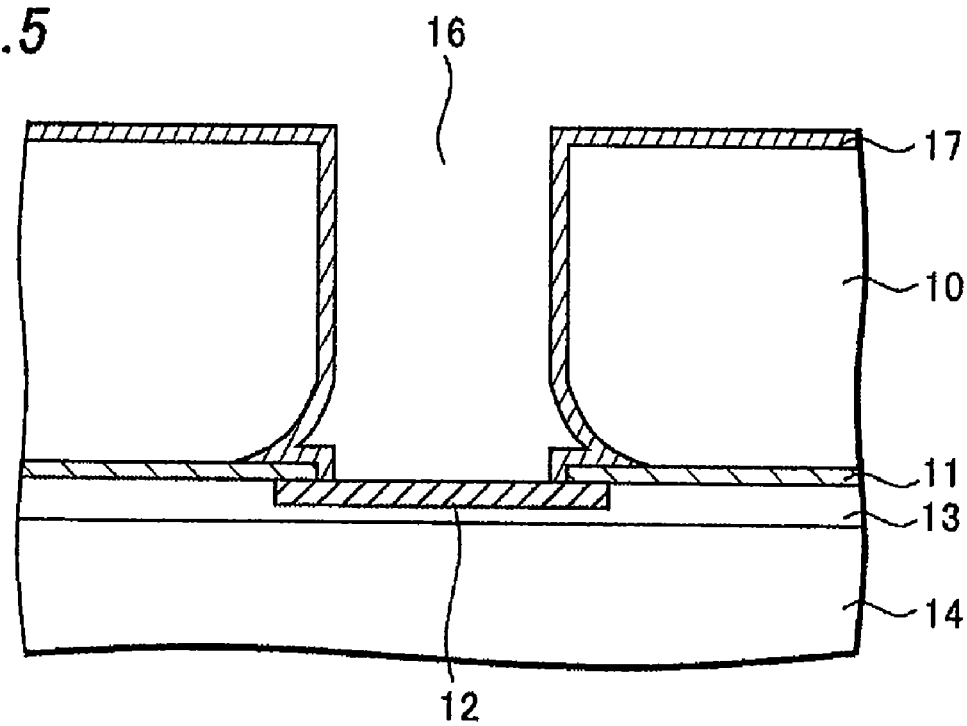

Next, as shown in FIG. 5, the second insulation film 17 is etched from the back surface of the semiconductor substrate 10 by, preferably, an anisotropic dry etching. The second insulation film 17 formed at the bottom of the via hole 16 is thinner than that formed on the back surface of the semiconductor substrate 10, corresponding to the depth of the via hole 16. Therefore, by the described etching, the second insulation film 17 is removed to expose a part of the pad electrode 12 at the bottom of the via hole 16, but the second insulation film 17 remains on the back surface of semiconductor substrate 10 and on the sidewall of the via hole 16.

Figure 6:
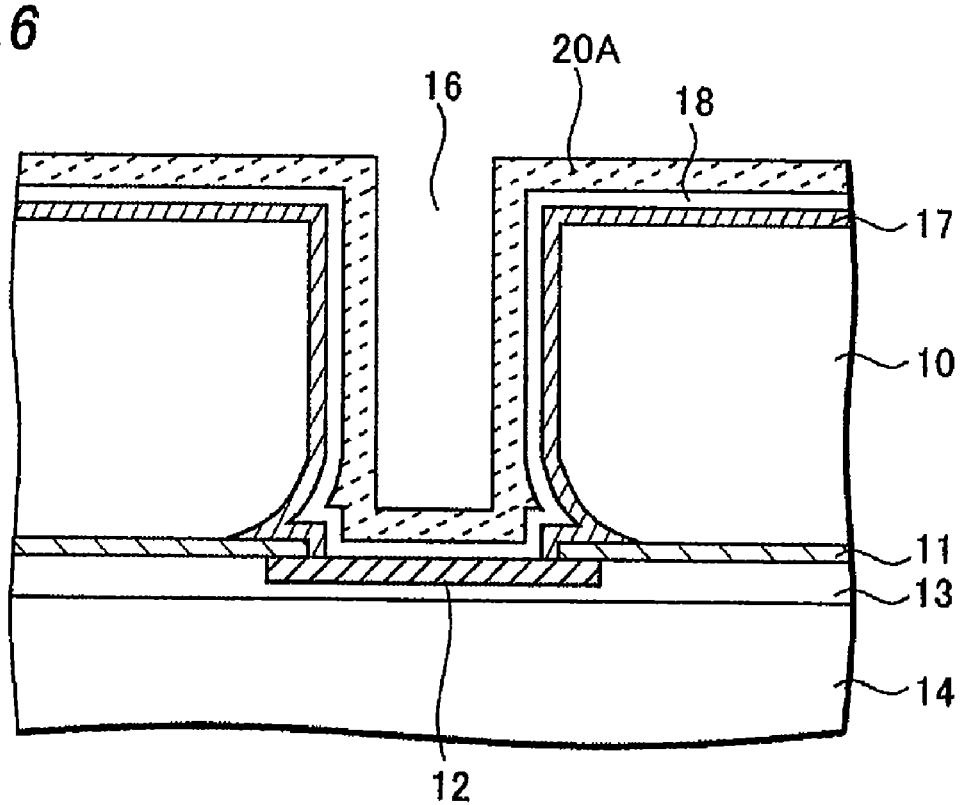

Next, as shown in FIG. 6, a barrier metal layer 18 is formed on the second insulation film 17 in the via hole 16 and on the back surface of the semiconductor substrate 10. The barrier metal layer 18 is formed of a metal layer such as a titanium tungsten (TiW) layer, a titanium nitride (TiN) layer, or a tantalum nitride (TaN) layer, for example.

The barrier metal layer 18 is formed by a sputtering method, a CVD method, an electroless plating method, or the other deposition methods, for example.

A seed layer (not shown) is formed on this barrier metal layer 18. This seed layer is to be an electrode for forming a wiring formation layer 20A by plating which will be described below, and formed of metal such as copper (Cu), for example.

In a case that the second insulation film 17 on the sidewall of the via hole 16 is formed of a silicon nitride film (SiN film), the barrier metal layer 18 can be omitted, since the silicon nitride film (SiN film) serves as a barrier against copper diffusion.

Next, the wiring formation layer 20A is formed so as to cover the barrier metal layer 18 and the seed layer formed on the back surface of the semiconductor substrate 10. The wiring formation layer 20A is a metal layer formed of copper (Cu) by an electrolytic plating method, for example.

Figure 7:
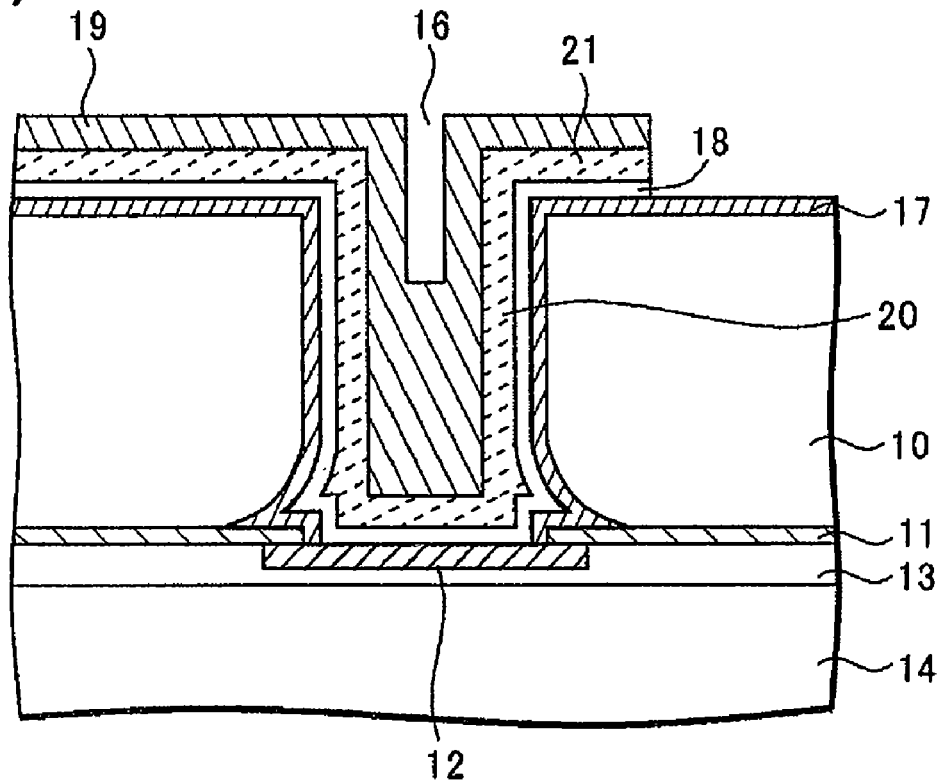

Then, as shown in FIG. 7, a second resist layer 19 is formed on the wiring formation layer 20A in a predetermined region. Then, the wiring formation layer 20A is patterned using the second resist layer 19 as a mask to form a penetrating electrode 20 and a wiring layer 21 continued to and electrically connected with this penetrating electrode 20. A plating thickness of the penetrating electrode 20 is determined to a thickness such that the penetrating electrode 20 does not fill the via hole 16 completely. Alternatively, the penetrating electrode 20 can be formed to fill the via hole 16 completely. It is noted that the predetermined region to be formed with the second resist layer 19 means a region to be formed with the wiring layer 21 having a predetermined pattern, which will be descried below, including a region formed with the via hole 16, on the back surface of the semiconductor substrate 10.

The penetrating electrode 20 is electrically connected with the pad electrode 12 exposed at the bottom of the via hole 16 with the seed layer and the barrier metal layer 18 therebetween. Furthermore, the wiring layer 21 connected with the penetrating electrode 20 is formed on the back surface of the semiconductor substrate 10 with the seed layer and the barrier metal layer 18 therebetween, having a predetermined pattern. Then, after the second resist layer 19 is removed, the barrier metal layer 18 is patterned and removed using the wiring layer 21 and the seed layer as a mask.

It is possible to form the above-described penetrating electrode 20 and wiring layer 21 in different processes, respectively. The formation of the penetrating electrode 20 and the wiring layer 21 can be performed not by the described electrolytic plating method using copper (Cu), but by other deposition methods using other metals. For example, the penetrating electrode 20 and the wiring layer 21 can be formed of aluminum (Al) or aluminum alloy, by a sputtering method. In this case, after a barrier metal layer (not shown) is formed on the back surface of the semiconductor substrate 10 excluding the via hole 16, a resist layer (not shown) is formed in a predetermined region on the barrier metal layer including the region formed with the via hole 16.

Figure 8:
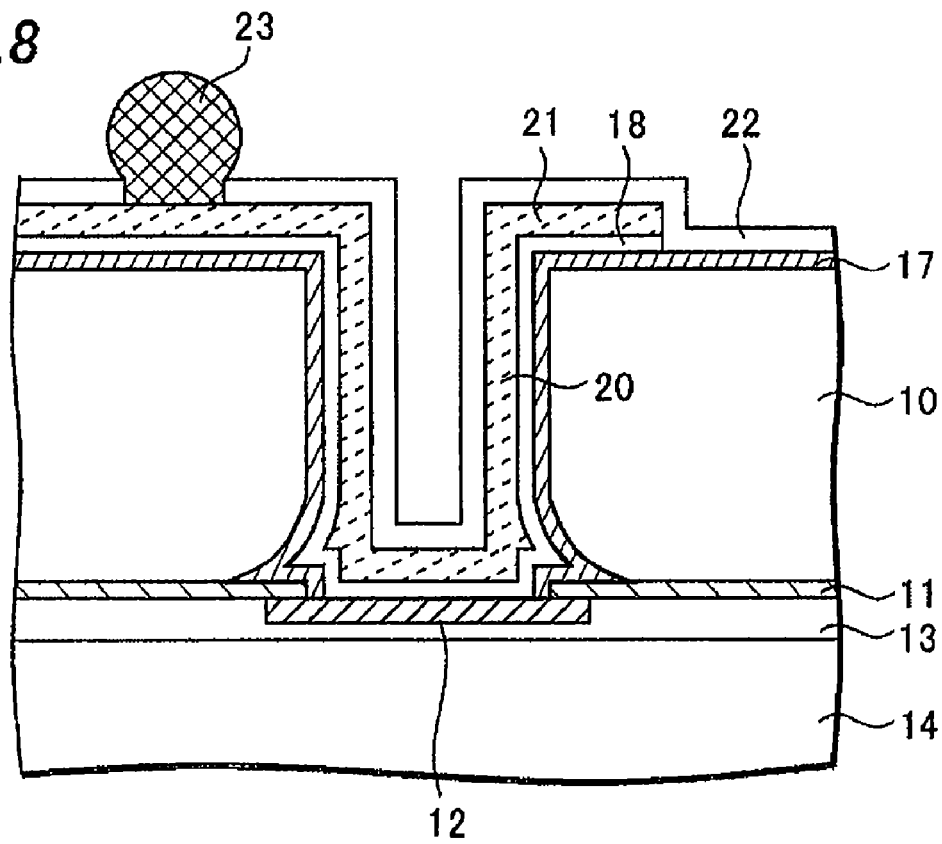

Then, the penetrating electrode and the wiring layer formed of the above-mentioned metal are formed by a sputtering method using the resist layer as a mask. Alternatively, the penetrating electrode 20 and the wiring layer 21 can be formed by a CVD method. Then, as shown in FIG. 8, a protection layer 22 formed of, for example, a resist material and so on is formed on the back surface of the semiconductor substrate 10 including in the via hole 16, that is, over the second insulation film 17, the penetrating electrode 20, and the wiring layer 21, covering these. An opening is provided in the protection layer 22 in a position corresponding to the wiring layer 21. Then, a ball-shaped conductive terminal 23 formed of, for example, metal such as solder is formed on the wiring layer 21 exposed in the opening.

Figure 9:
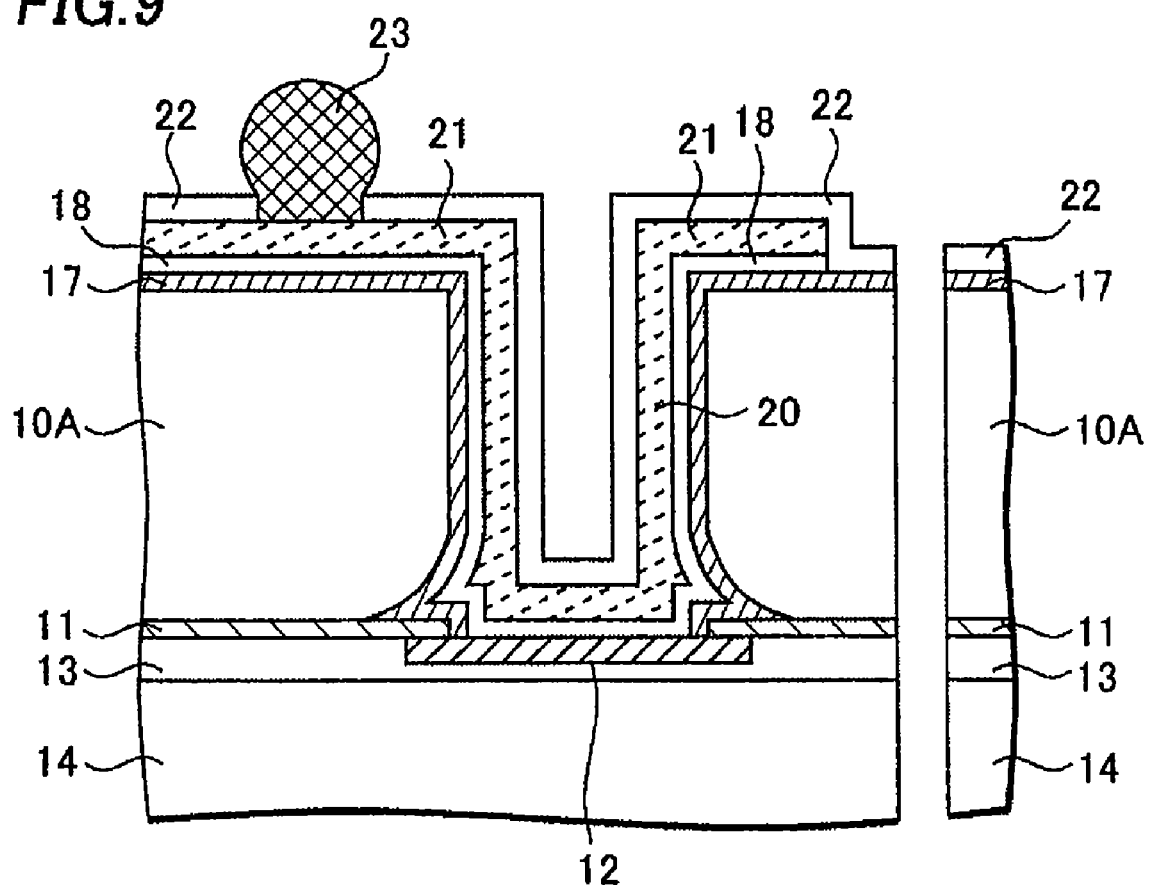
FIG. 9 is a cross-sectional view for explaining a semiconductor device and the manufacturing method thereof of the embodiment of the invention.

Next, as shown in FIG. 9, the semiconductor substrate 10 is diced along a dicing line (not shown). Then, a plurality of semiconductor devices each formed of a semiconductor die 10A having the penetrating electrode 20 is completed.

As described above, in the semiconductor device and the manufacturing method thereof of the embodiment, the semiconductor device having the opening diameter A of the via hole 16 at its bottom larger than the width C of the pad electrode 12 can be manufactured. Therefore, stress accumulated in the pad electrode 12 (stress accumulated when the pad electrode is deposited) can be released from the bottom of the via hole 16 more effectively than in the conventional art.

This can minimize the deformation of the pad electrode 12 exposed at the bottom of the via hole 16. Furthermore, the minimization of the deformation of the pad electrode 12 exposed at the bottom of the via hole 16 prevents connection failure occurring between the pad electrode 12 and the penetrating electrode 20 connected therewith, thereby enhancing reliability in the connection between the penetrating electrode 20 and the pad electrode 12. As a result, the reliability and yield of the semiconductor device having the penetrating electrode 20 can be enhanced.

The above-described embodiment is not limited to the formation of the conductive terminal 23. That is, the conductive terminal 23 is not necessarily formed as long as the penetrating electrode 20 and the wiring layer 21 can be electrically connected with a circuit board (not shown). For example, when the semiconductor device is an LGA (Land Grid Array) type semiconductor device, it is not necessary to form the conductive terminal 23 on the wiring layer 21 in a region partially exposed from the protection layer 22.

Furthermore, the described embodiment is not limited to the formation of the wiring layer 21. That is, when the penetrating electrode 20 is formed filling the via hole 16 completely, the wiring layer 21 is not necessarily formed. For example, the penetrating electrode 20 can be directly connected with a circuit board (not shown) without the wiring layer 21 and the conductive terminal 23 therebetween. Alternatively, the penetrating electrode 20 can have the conductive terminal 23 on the penetrating electrode 20 exposed at the opening of the via hole 16, and connected with a circuit board (not shown) with the conductive terminal 23 therebetween and without the wiring layer 21 therebetween.

Figure 10A:
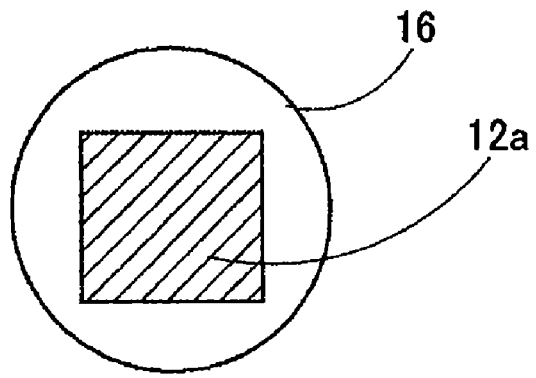
FIGS. 10A, 10B, and 10C are views showing a positional relation between a pad electrode and a via hole of the invention.
Figure 10B:
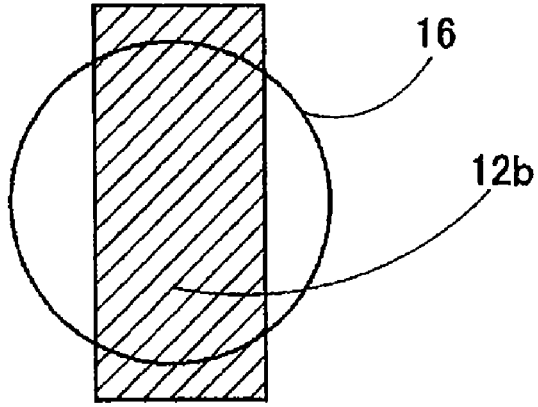
Figure 10C:
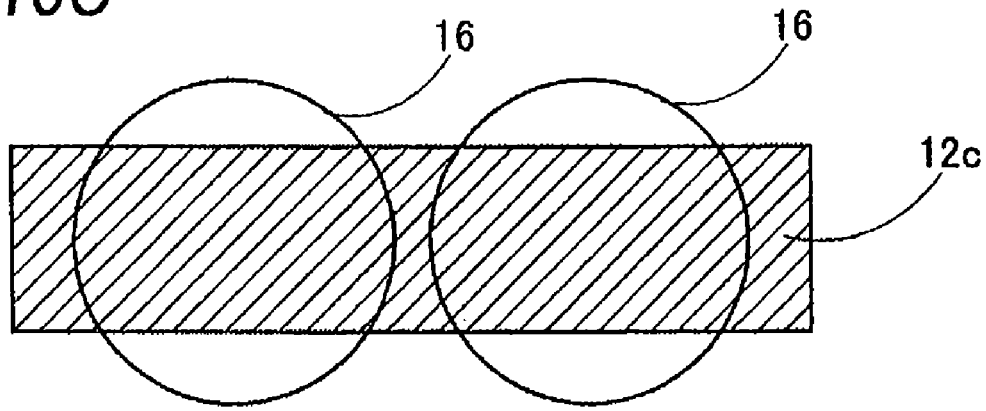
Figure 11:
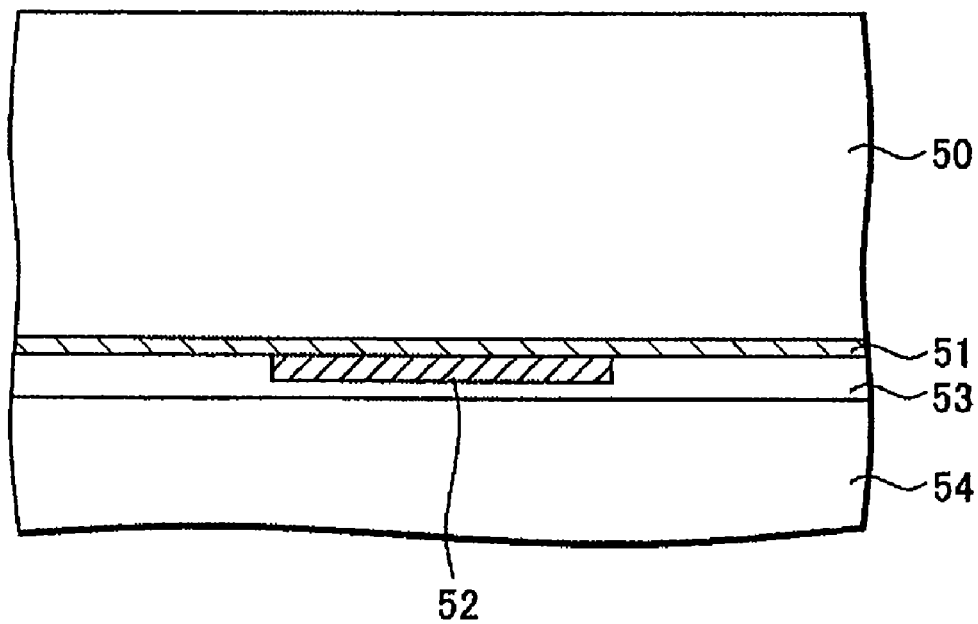
FIGS. 11 and 12 are cross-sectional views showing a conventional semiconductor device manufacturing method.
Figure 12:
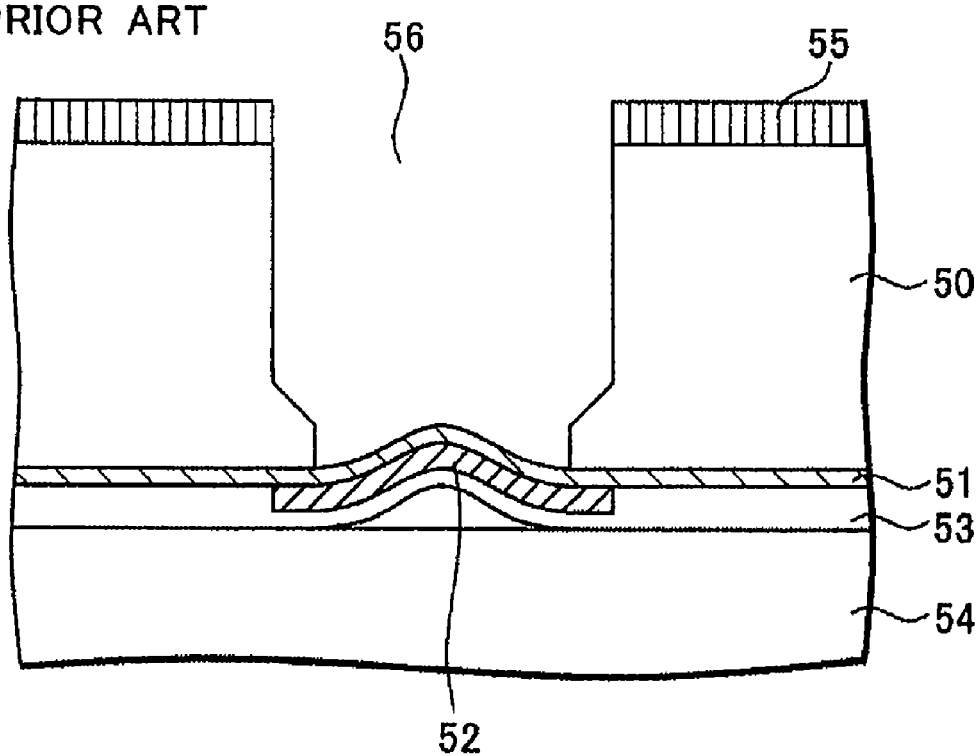

FIGS. 10A, 10B, and 10C are plan views showing a positional relation between the pad electrode 12 and the via hole 16 of the invention. FIG. 10A shows an example that the opening diameter of the via hole 16 is larger than the width of the pad electrode 12a, and FIGS. 10B and 10C show examples that some portions of the opening rim of the via hole 16 are not positioned above the pad electrode 12, and the via hole 16 has both regions where its opening diameter is larger and smaller than the width of the pad electrode 12b. FIG. 10C shows an example that a plurality of via holes 16 is formed for one pad electrode 12c. Since the pad electrode 12 starts projecting with the opening rim positioned above the pad electrode 12 as a fulcrum in the conventional semiconductor device, the pad electrode 12 largely stretches from this opening rim. In this embodiment, however, there does not exist the opening rim positioned above pad electrode 12, which serves as the fulcrum of the projection, so that the projection can be prevented.

Furthermore, even in the case that only some portions of the opening rim of the via hole 16 are not positioned above the pad electrodes 12b and 12c as shown in FIGS. 10B and 10C, that is, the whole pad electrode 12a is not open to the opening of the via hole 16, unlike in FIG. 10A, it is possible to prevent the projection of the pad electrode 12. In the invention, the projection can be reduced even in the case that only some portions of the opening rim are not positioned above the pad electrode 12, thereby enhancing the reliability of the semiconductor device.

What is claimed is:

1. A method of manufacturing a semiconductor device, comprising:
    providing a semiconductor substrate comprising a first insulation film disposed on a front surface thereof and a pad electrode disposed on the first insulation film;
    etching the semiconductor substrate from a back surface thereof to form a via hole to expose the first insulation film located above the pad electrode; and
    etching the exposed first insulation film to expose at least part of the pad electrode,
    wherein the etching of the semiconductor substrate is performed so that a diameter of the via hole at the front surface is larger than a width of the pad electrode.

2. The method of claim 1, further comprising forming a second insulation film on the back surface of the semiconductor substrate and in the via hole, exposing part of the pad electrode by etching the second insulation film, forming a penetrating electrode electrically connected to the pad electrode in the via hole and a wiring layer electrically connected to the penetrating electrode and extending onto the second insulation film on the back surface of the semiconductor substrate, forming a protection layer on the back surface of the semiconductor substrate so as to cover at least part of the wiring layer, and cutting the semiconductor substrate to produce a semiconductor die.

3. The method of claim 2, further comprising forming a conductive terminal on the wiring layer not covered by the protection layer.

4. The method of claim 1, wherein the etching of the semiconductor substrate is performed so that the diameter of the via hole at the front surface is made larger than a diameter of the via hole at a middle portion thereof by over-etching the semiconductor substrate.

5. A method of manufacturing a semiconductor device, comprising:
    providing a semiconductor substrate comprising an insulation film disposed on a front surface thereof and a pad electrode disposed on the insulation film;
    etching the semiconductor substrate from a back surface thereof to form a via hole to expose the insulation film located above the pad electrode; and
    etching the exposed insulation film to expose at least part of the pad electrode,
    wherein the etching of the semiconductor substrate is performed so that at least part of a rim portion of the via hole at the front surface extends beyond an area of the front surface covered by the pad electrode.

6. A method of manufacturing a semiconductor device, comprising:
    providing a semiconductor substrate comprising a first insulation film disposed on a front surface thereof and a metal layer disposed on the first insulation film;
    etching the semiconductor substrate from a back surface thereof to form a via hole to expose the first insulation film located above the metal layer; and
    etching the exposed first insulation film to expose at least part of the metal layer,
    wherein the etching of the semiconductor substrate is performed so that a diameter of the via hole at the front surface is larger than a width of the metal layer.

* * * * *